US010622267B2

(12) United States Patent
Burns et al.

(10) Patent No.: US 10,622,267 B2
(45) Date of Patent: Apr. 14, 2020

(54) FACILITATION OF SPIN-COAT PLANARIZATION OVER FEATURE TOPOGRAPHY DURING SUBSTRATE FABRICATION

(71) Applicant: Tokyo Electron Limited, Minato-ku, Tokyo (JP)

(72) Inventors: Ryan L. Burns, Austin, TX (US); Benjamen M. Rathsack, Austin, TX (US); Mark H. Somervell, Austin, TX (US); Makoto Muramatsu, Kikuyou-cho (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/724,632

(22) Filed: Oct. 4, 2017

(65) Prior Publication Data

US 2018/0096905 A1 Apr. 5, 2018

Related U.S. Application Data

(60) Provisional application No. 62/404,094, filed on Oct. 4, 2016.

(51) Int. Cl.
*H01L 21/66* (2006.01)
*H01L 21/3105* (2006.01)
*H01L 21/02* (2006.01)
*G06F 17/50* (2006.01)

(52) U.S. Cl.
CPC .......... *H01L 22/20* (2013.01); *G06F 17/5009* (2013.01); *H01L 21/31055* (2013.01); *H01L 21/02282* (2013.01); *H01L 22/12* (2013.01)

(58) Field of Classification Search
CPC ............... H01L 22/20; H01L 21/02282; H01L 21/31055; G03F 7/70441; G03F 1/36
See application file for complete search history.

(56) References Cited

U.S. PATENT DOCUMENTS

| 7,175,940 | B2 | 2/2007 | Laidig et al. |
| 7,433,791 | B2 | 10/2008 | Park et al. |
| 7,452,817 | B2 | 11/2008 | Yoon et al. |
| 8,024,675 | B1 * | 9/2011 | Gupta ................. G06F 17/5068 716/132 |

(Continued)

FOREIGN PATENT DOCUMENTS

KR 10-0734305 B1 6/2007

OTHER PUBLICATIONS

International Searching Authority, International Search Report and Written Opinion issued in related Application No. PCT/US2017/055098 dated Jan. 19, 2018, 9 pp.

(Continued)

*Primary Examiner* — Christine A Enad
(74) *Attorney, Agent, or Firm* — Wood Herron & Evans LLP

(57) ABSTRACT

Described herein are technologies to facilitate device fabrication, especially those that involve spin-on coatings of a substrate (e.g., wafer). More particularly, technologies described herein facilitate the planarization (i.e., flatness) of spin-on coatings during the device fabrication to form a uniformly planar film or layer on the substrate. This abstract itself is not intended to limit the scope of this patent. The scope of the present invention is pointed out in the appending claims.

19 Claims, 12 Drawing Sheets

(56) References Cited

U.S. PATENT DOCUMENTS

| | | | |
|---|---|---|---|
| 2007/0059946 A1* | 3/2007 | Mulders | G03F 7/162 |
| | | | 438/780 |
| 2010/0012622 A1* | 1/2010 | Panga | B82Y 10/00 |
| | | | 216/52 |
| 2011/0079579 A1* | 4/2011 | Allen | G03F 7/0752 |
| | | | 216/38 |
| 2011/0312180 A1 | 12/2011 | Wang | |
| 2012/0307233 A1 | 12/2012 | Boguslayskiy et al. | |
| 2013/0113086 A1* | 5/2013 | Bai | B81C 1/00611 |
| | | | 257/632 |
| 2016/0048080 A1 | 2/2016 | deVilliers | |
| 2016/0300726 A1 | 10/2016 | deVilliers | |

OTHER PUBLICATIONS

The International Bureau of WIPO, International Preliminary Report on Patentability in corresponding International Application No. PCT/US2017/055098 dated Apr. 9, 2019.

* cited by examiner

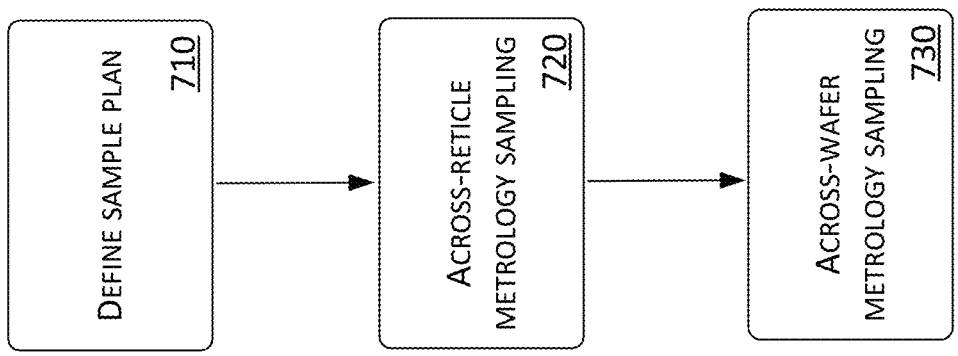
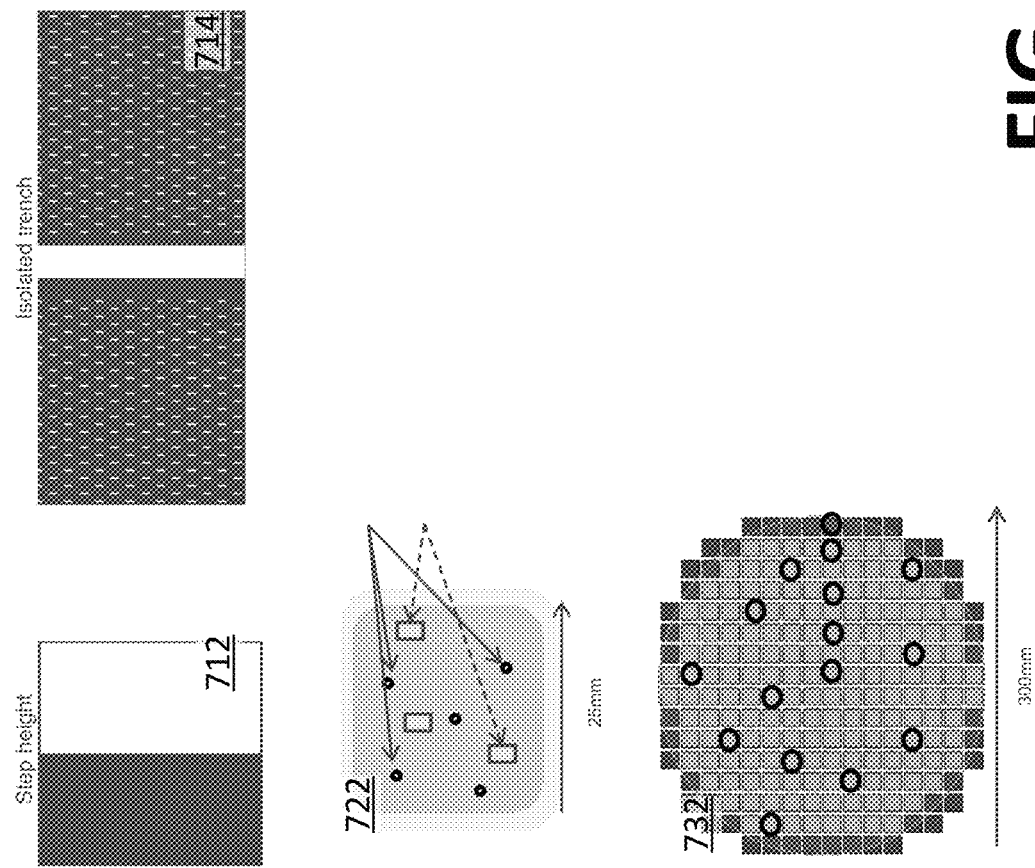
FIG. 7

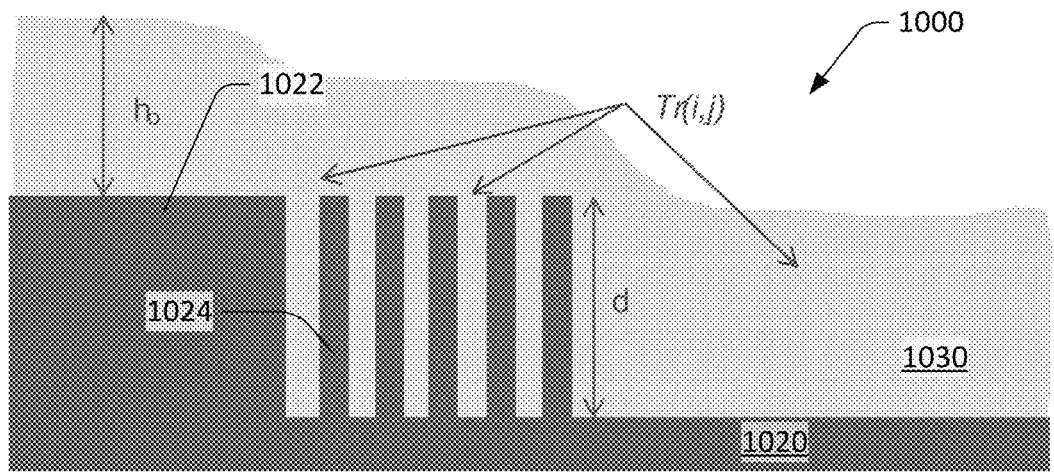

Desired Output:
$h(x,y)$ = simulated thickness

Geometric dimensions:
$Tr(i,j)$ = trench locations on grid
$d$ = trench depth
$h_0$ = blanket film thickness
$p(x,y)$ = proximity function

Material properties:
$\gamma$ = material surface tension
$\rho$ = material density
$P_v$ = vapor pressure

Process parameters:
$\omega$ = spin speed

Known quantities:
$Rc$ = calculation radius
$r$ = radius from referencpoint
$C$ = relational constant

FIG. 10

FACILITATION OF SPIN-COAT PLANARIZATION OVER FEATURE TOPOGRAPHY DURING SUBSTRATE FABRICATION

RELATED APPLICATIONS

This application is related to and claims priority to U.S. Provisional Patent Application Ser. No. 62/404,094 filed on Oct. 4, 2016, the entire contents of which are herein incorporated by reference.

BACKGROUND

In the manufacture of micro-scale or nano-scale devices, various fabrication processes are executed and repeatedly performed to create functional device elements on a substrate. Examples of micro-scale or nano-scale devices include semiconductor devices, electronic devices, mechanical devices, etc. Examples of fabrication processing include processes for film-forming, etching, patterning, cleaning, doping, annealing, treating, planarizing, etc.

Typically, these devices are produced as part of a layered device fabrication process of, for example, a substrate (e.g., a semiconductor wafer). In some instances, a coating is "spun-on" to the substrate to form a uniform layer or film. Spin coating a material enhances its uniformity in coverage and planarization. As used herein, planarization or planar refers to the consistent flatness of a layer or film.

Spin coating (or spin-on coating) is a procedure used to deposit uniform thin films to flat substrates (e.g., semiconductor wafer). Usually, a small amount of coating material is applied on the center of the substrate, which is either spinning at low speed or not spinning at all. The substrate is then rotated at high speed in order to spread the coating material by centrifugal force. A machine used for spin coating is called a spin coater, or simply spinner.

Rotation is continued while the fluid spins off the edges of the substrate, until the desired thickness of the film is achieved. The applied solvent is usually volatile, and simultaneously evaporates. So, the higher the angular speed of spinning, the thinner the film. The thickness of the film also depends on the material properties, such as the viscosity and concentration of the solution and the solvent.

Traditionally, the micro- and nano-fabrication of semiconductor transistors are formed in-plane—thus are often referred to two-dimensional (2D) or planar devices. When formed, the semiconductor transistors are interconnected via metallization/wiring layers formed in overlying layers of circuitry. While scaling efforts have greatly increased the number of transistors per unit area in 2D circuits, the scaling efforts introduce new and greater challenges as scaling enters single digit nanometer-scale device features.

In addition, device fabricators have expressed a desire for out-of-plane, or three-dimensional (3D), non-planar devices. The decreasing scales for fabrication coupled with the ascension of device features into the third dimension have led to increasingly complex topography. Thus, it is more difficult than ever to achieve planarization.

SUMMARY

Described herein are technologies to facilitate device fabrication, especially those that involve spin-on coatings of a substrate (e.g., wafer). More particularly, technologies described herein facilitate the planarization (i.e., flatness) of spin-on coatings during the device fabrication to form a uniformly planar film or layer on the substrate.

BRIEF DESCRIPTION OF THE DRAWINGS

FIG. 7 illustrates a model calibration methodology for multiple scales of interest in accordance with the technology described herein.

FIG. 10 provides an illustration of a cross-section of a substrate and a film along with relevant terms, which help with the explanation of implementations of the technology described herein.

The Detailed Description references the accompanying figures. In the figures, the left-most digit(s) of a reference number identifies the figure in which the reference number first appears. The same numbers are used throughout the drawings to reference like features and components.

DETAILED DESCRIPTION

Figure 1:
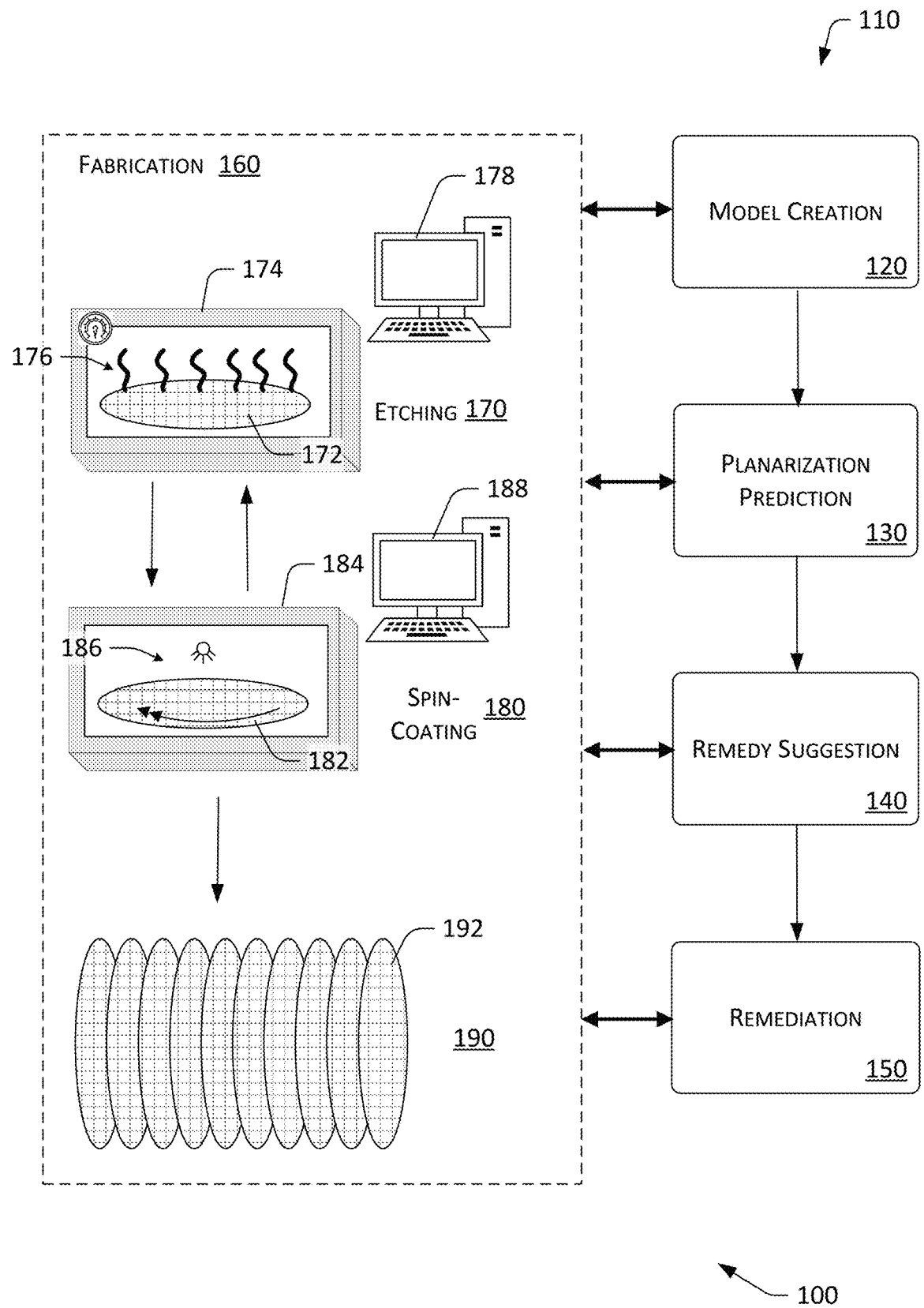
FIG. 1 illustrates an example scenario in which one or more implementations of the technology described herein may be incorporated.

Described herein are technologies to facilitate device fabrication, especially those that involve spin-on coatings of a substrate (e.g., wafer). More particularly, technologies described herein facilitate the planarization (i.e., flatness) of spin-on coatings during the device fabrication to form a uniformly planar film or layer on the substrate.

Typically, with device fabrication, it is desirable to achieve a uniform planarization (i.e., flatness) of spin-on coatings across the substrate. That is, the film that results from the spin-on coating should have a uniformly flat surface. The resulting uniformity (or lack thereof) of flatness is affected or achieved by many planarization-enhancing factors and actions. Such factors/actions include material properties, underlying topography, and post-application smoothing.

The properties of the materials applied to a substrate affect the resulting flatness of the final layer. Examples of such properties include the viscosity of the coating being dispensed, the amount of material, the location of the material on the substrate, and the timing/speed/acceleration of the spin.

In addition, the underlying topography of the substrate affects the uniformity of the film. Typically, features are etched into the substrate to form the devices. This etching forms a specific topography on the resulting surface. Because of this, this etched or patterned surface is called the "feature topography" herein. Subsequently, the next spin-on coating is applied to the feature topography. Since the feature topography is not a flat surface, the features affect the coating application and ultimately the uniformity of the resulting film.

Moreover, after a film is applied to a substrate, the film may be nor-uniform. This non-flat film can be fixed after application of the coating Either mechanically or chemically. That is, the rough or bumpy film may be polished using the appropriate chemicals and/or with a mechanical "polisher."

While these actions and options are available to enhance and facilitate the planarization of a spin-on film, there is no existing technology to effectively predict the non-uniformity of the next to-be-applied layer (given known conditions). Consequently, no existing technology offers recommendations for planarization-enhancing factors and actions that may be employed to ameliorate a predicted lack of flatness of the next to-be-applied layer.

However, one or more embodiments of the technology described herein may effectively predict the non-uniformity of the next to-be-applied layer (given known conditions). With this prediction, one or more embodiments may generate and recommend (or automatically implement) particular planarization-enhancing factors and actions that may be employed to ameliorate a predicted lack of flatness of the next to-be-applied layer.

For example, one or more embodiments may suggest or implement adjustments/selection of materials or in the application of that material. Alternatively or in addition, one or more embodiments may suggest or implement hardware solutions, such as chemical and/or mechanical smoothing of a non-planar film. Alternatively or in addition, one or more embodiments may suggest or implement a re-design of features of an underlying surface.

The technology described herein can facilitate the creation and development of a comprehensive film thickness spin coat model over patterned topography including all length scales of relevance. The ability to predict film thickness outcomes over patterned topography for any design, process, and material combination is very powerful as manufacturing technologies become more reliant on 3D structures (e.g., finfets, through silicon vias, gate all around, etc.). This technology may lead to control loops to feed back or forward this information into process correction capabilities, design improvements and will ultimately lead to increases in product yield.

The micro- and nano-scale electronics processing to build integrated circuits requires multiple film coatings over patterned topography. Deviations in film thickness for spin-on coatings over patterned topography often drive downstream processing beyond required specifications. The three (3) length scales of interest are substrate scale, die scale, and feature scale. A detailed understanding and simulation of film coating thickness over topography at these different length scales at positions across the chip stack can allow for corrections in a number of downstream processes.

Unit operations having errors introduced due to deviations in film thickness height include but are not limited to: lithographic CD (critical dimension) changes due to reflectivity, lithographic focus control, etch depth, and subsequent deposition processes. Additionally, novel 3D applications and processes such as pattern reversals and exhuming materials post spacer processes may require stringent levels of film thickness control over topography.

The simulation and knowledge of film thickness over patterned topography are based on, for example, incoming pattern density, planar film thickness, material properties, and spin on process conditions. The described technology includes a method of calibrating a model or models to accurately predict spin on film thickness over patterned topography. Three length scales of interest in semi-conductor design and processing are discussed. A method to design test structures on an experimental mask set to be used for coating model calibration is described herein, along with metrology options. Creating a data sample plan is explained across the length scales of interest, and the method to fit a pattern density model is described in detail along with the mathematical forms that can be used.

The method to calibrate or predict film thickness may be used for blanket films applied to the patterned substrate to account thickness variations related to pattern density and the properties of the applied film. Further, the methods described herein may also apply to blanket films which receive post-spin on processing such as an etch back process (e.g., wet or dry), a UV treatment, a thermal treatment, a chemical treatment, or a combination thereof. In this embodiment, the blanket film may be deposited on the wafer, and undergo additional treatments prior to subsequent lithography processing. Hence, the pattern dependencies of the blanket film, the treated film, or a combination thereof may be modeled using the techniques disclosed herein.

Example Scenario

FIG. 1 illustrates an example scenario 100 in which one or more implementations of the technology described herein may be incorporated. The example scenario 100 includes a functional representation 110 of an example implementation of the technology described herein and a fabrication 160 of a semiconductor wafer (which is an example of a substrate fabrication contemplated for use with the technology described herein.)

As depicted, the fabrication 160 includes an etching 170 section, a spin-coating 180 section, and an intermediate/final stack or holding bin 190. These sections of this fabrication 160 are merely intended to represent the portions of a typical fabrication that are most relevant to the example implementation related to this figure. It does not represent all sections or portions of a suitable fabrication for this or other implementations of the technology described herein. Furthermore, the order of the sections of the fabrication 160 is offered for illustration purpose only and it does not represent any required or necessary order for this or any other implementation.

As depicted, the etching 170 includes a wafer 172 in an etch chamber 174 being etched (e.g., via plasma). For example, with plasma etching, a plasma 176 removes material from the surface of the wafer 172. The plasmas of the process gasses convert the material to be etched from the solid to the gaseous phase, and the vacuum pump (not shown) extracts the gaseous products. The use of masks can also ensure the etching of only parts of the surface or structures. The etching process is controlled and monitored by one or more computer systems 178.

At least some of the techniques described herein pertain to device fabrication using precision etch techniques. Several instances manifest in semiconductor manufacturing in both front end of the line (FEOL, e.g., transistor fabrication) through to the back end of the line (BEOL, e.g., interconnect fabrication), where oxide and nitride films (typically silicon-containing, in nature) need to be etched with a high degree of precision.

As depicted, the spin-coating 180 includes a spinning wafer 182 in a coating chamber 184. For example, a coating 186 may be dispensed onto the surface of the wafer 182. Ideally, the spin-coat material will form an even or uniform layer on the wafer 182. The spin-coating process is controlled and monitored by one or more computer systems 188.

The intermediate/final stack or holding bin 190 represents a collection of wafers (such as wafer 192) that has completed the fabrication process that includes repeated etching and coating processes. Alternatively, the holding bin 190 may hold wafers as an intermediate step of the fabrication process.

The functional representation 110 of the example implementation of the technology described herein includes four functional sections. Each of these sections interacts with some portion of the fabrication 160. The four functional sections include model creation 120, planarization prediction 130, remedy suggestion 140, and remediation 150. Each of these functional sections interacts with other sections and with one or more portions of the fabrication process and components. The details of each section are described below in portions of the document that focus on each section.

However, in short, the model creation 120 involves the generation of a model of the feature topography of an etched wafer. That is, a computer system generates a computer-generated 3D rendering of the many features of an etched wafer based on design and process knowledge Example details that are related to the model creation 120 are described and discussed below with regard toward FIGS. 2-8.

The model creation 120 includes receiving substrate patterning information for a patterned semiconductor substrate. Then, a topography map of a patterned substrate is generated. That topography map is based, at least in part, on the substrate patterning information. The substrate patterning information includes feature dimensions, mask tone, or film thickness measurement values. The topography map includes features varying by height, width, and the distance between the features.

The planarization prediction 130 uses information about various material and environmental properties to simulate the spin-coat application to the modeled feature topology. Examples of details that are related to the planarization prediction 130 are described and discussed below with regard toward FIGS. 9-10.

The simulation and knowledge of film thickness over feature topography are based on, for example, incoming pattern density, planar film thickness, material properties, and spin on process conditions. The pattern density may, for example, be expressed in the form of a number over a specified area. Alternatively, the pattern density may be provided, for example, in the form of a surface map indicating local pattern density values at locations in the mask field.

Examples of planar film thickness includes 100 nm or 2 um. The planar film thickness may be expressed as a height over a distance value. Examples of material properties includes density, viscosity, surface tension, and vapor pressure. Examples of spin-on process conditions includes spin speed of 2000 RPM and post apply bake of 60 sec at 100 C.

A method of coating a substrate with a planarization film, including methods of calibrating a model or models to accurately predict spin on film thickness over patterned topography, is described herein. Multiple length scales of interest in semi-conductor design and processing are discussed. The method to design test structures on an experimental mask set to be used for coating model calibration is described herein, along with metrology options. Creating a data sample plan is explained across the length scales of interest, and a method to fit a pattern density model is described herein along with the mathematical forms that can be used. Furthermore, a feed-back methodology for electronic device automation and a feed-forward methodology for unit processing are described herein.

The planarization prediction 130 includes receiving substrate patterning information and a film thickness model based, at least in part, on a thickness of a film being deposited on the patterned substrate and an arrangement of features on the patterned substrate. The planarization prediction 130 also includes generating a film thickness model (i.e., a simulation of film thickness) of the patterned substrate based, at least in part, on the substrate patterning information and the film thickness model.

The film thickness data is associated with a film deposited on the semiconductor substrate. The model of the film thickness is a model for the semiconductor substrate that is based, at least in part, on the plurality of film thickness points. The model of film thickness includes an estimated film thickness based, at least in part, on a blanket film thickness, a localized pattern height, a localized pattern width, and a localized density of features within the patterned substrate. The plurality of film thickness data includes thickness data of one or more films on the semiconductor substrate. The film includes a blanket film, a patterned film, or a treated film.

Generating the deposited film thickness model involves: assigning grid points across the patterned substrate; determining a trench depth at or around the grid points on the substrate; setting a calculation distance from the grid points; and determining a film thickness for the grid points based, at least in part, on a blanket film thickness, the trench depth proximate to the grid point, a surface area around the grid point, and values from adjacent grid points within the calculation distance of the target grid point.

The arrangement of features is based, at least in part, on one or more of the following: feature depth, feature width, or feature surface area at different locations across the patterned substrate.

The planarization prediction 130 also includes: comparing the deposited film thickness model to a predetermined specification; adjusting one or more process conditions based, at least in part, on the comparing of the deposited film thickness model and the predetermined specification.

The process conditions include one or more of following: spin speed for a film being deposited on a substrate, focus or dose of a lithography process used to pattern the substrate, etch time, or etch power.

The planarization prediction 130 also includes: comparing the deposited film thickness model to a predetermined specification; adjusting one or more process targets based, at least in part, on the comparing of the process simulations with the predetermined value.

The process targets include one or more of the following: deposition thickness, trench depth, film non-uniformity.

The planarization prediction 130 also includes: comparing the deposited film thickness model to a predetermined specification; adjusting one or more design conditions based, at least in part, on the comparing of the deposited film thickness model and the predetermined specification.

The design conditions include one or more of following: device layout, dummy fill layout, mask layout, or other conditions that impact pattern density on the patterned substrate. The plurality of film thickness data includes thickness data of one or more films on the semiconductor substrate. The film includes a blanket film, a patterned film, or a treated film.

Based upon calibration model of the model creation 120 and the prediction of the planarization prediction 130, the remedy suggestion 140 generates one or more recommendations to facilitate or enhance planarization of the spin-on coating for that feature topology. Examples details that are related to the remedy suggestion 140 are described and discussed below with regard toward FIGS. 10-11.

The remedy suggestion 140 includes a determination of the film thickness of an area of the film-thickness model falls with a defined range. For example, in some implementations the film thickness measurements have a defined range from 95 nm to 105 nm. For example, with that defined range, if the film thickness over topography is measured to be 93 nm, then corrective action would be taken. Then, based upon that determining, the area of the film-thickness model is declared to be planar. If not, then remedies are suggested that will enhance planarization of that area of the film-thickness model. The remedies affect the substrate fabrication.

Moreover, remediation 150 involves action being taken based on the recommendations of the remedy suggestion section. Such action may be automatic, manual, or some combination thereof. Examples details that are related to the remediation 150 are described and discussed below with regard toward FIGS. 10-11.

Model Creation

FIGS. 2-8 illustrate and demonstrate example processes and details related to the model creation 120 of FIG. 1.

Figure 2:
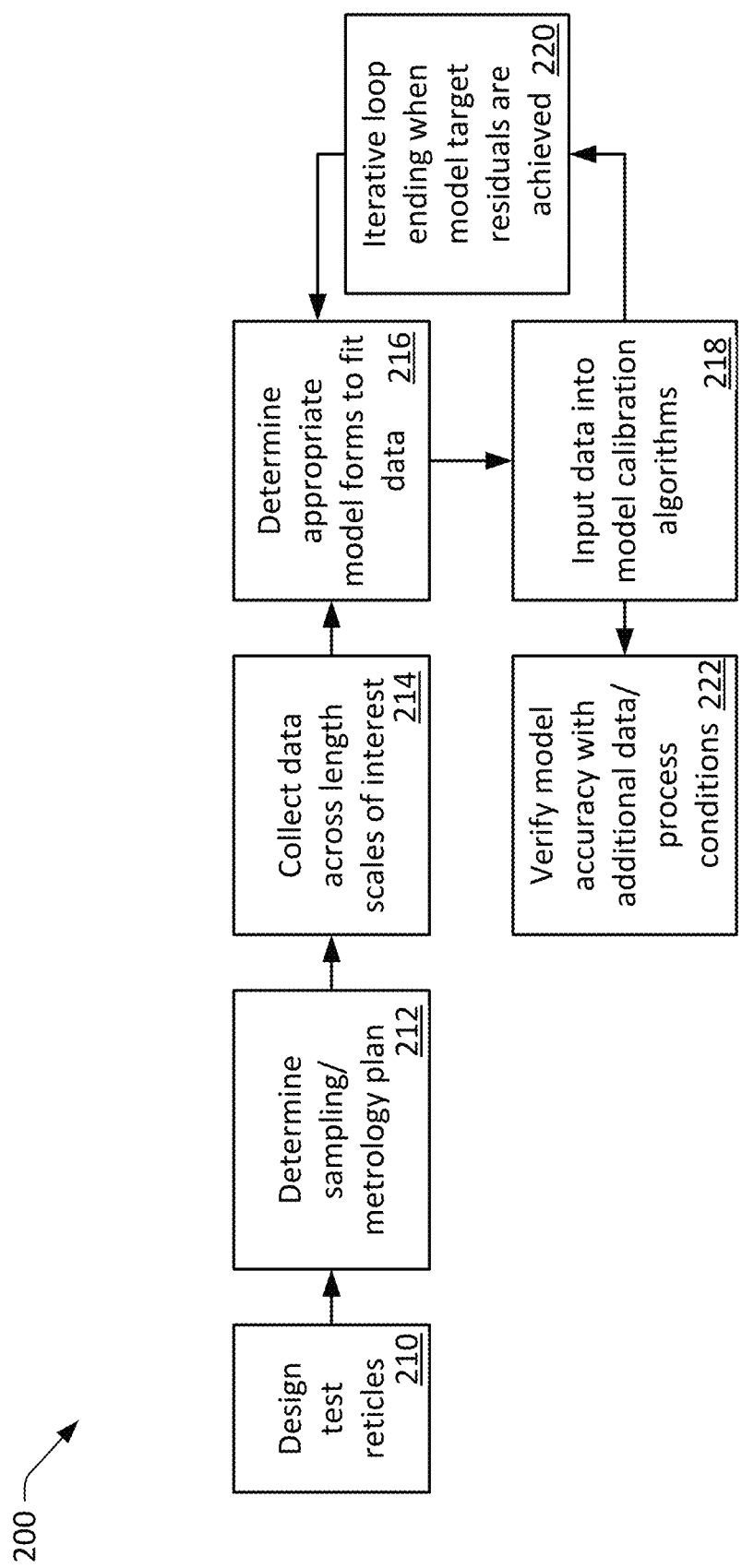
FIG. 2 provides a flow chart illustrating a method of facilitating planarizing a substrate in accordance with the technology described herein.

FIG. 2 illustrates an example high-level flowchart of an implementation of the creation of a calibration model (such as model creation 120 of FIG. 1). More particularly, FIG. 2 shows an example process 200 for calibrating a film thickness model over patterned topography. The process 200 may be implemented using one or more computer systems.

At 210, the computer system employs a design of appropriate test structures on a mask. In some implementations, such a design may be created or supplied, at least in part, design system or created manually.

At 212, the computer system implements an appropriate metrology/sampling plan for data collection. In some implementations, this plan may be provided and/or created planning system or created manually.

At 214, the computer system collects thickness data across length scales of interest. The scales of interest is discussed below with regard to FIG. 3.

At 216, the computer system determines, based on the signatures observed or analyzed, the appropriate model forms that best-fit the data.

At 218-220, the data is input in model calibration algorithms and based on target residuals can be moved through an iterative process to fit the most appropriate model forms and parameters.

At 222, the model is verified with additional data and/or process conditions.

Figure 3:
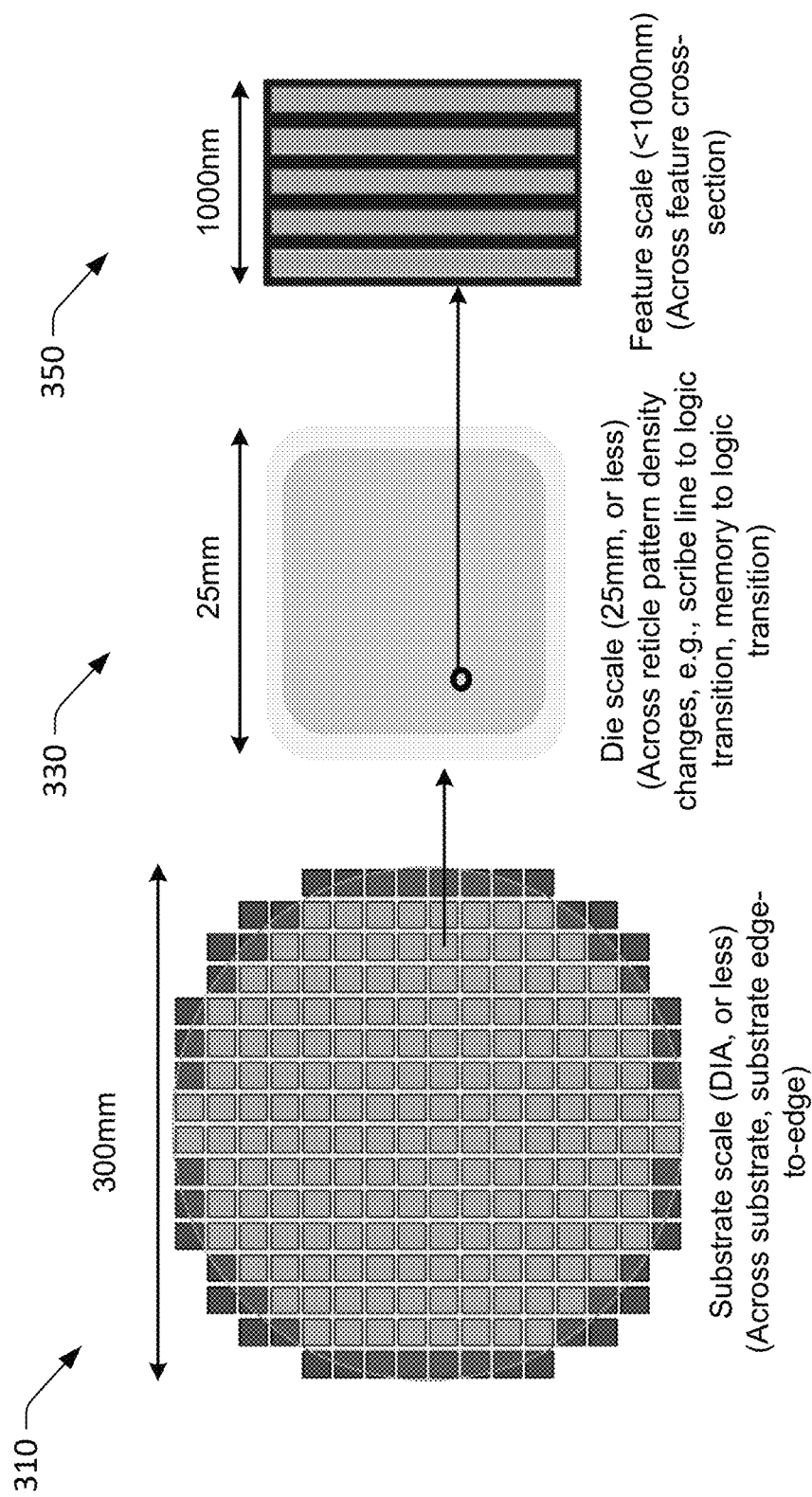
FIG. 3 illustrates a substrate and the length scales of interest and the planarization signatures expected in accordance with the technology described herein.

FIG. 3 demonstrates that developing a comprehensive film thickness model over topography involves consideration of appropriate length scales. Substrate scale effects, across mask effects, and pattern specific coating signatures are factors to feed forward to an available corrective process.

The substrate scale is demonstrated at 310. At the substrate scale characterizing film, coating differences require a center to edge measurement signature over identical patterns in the mask field. The mask field pattern density contributes to the film thickness signature over the topography.

The die scale is demonstrated at 330. The die scale (which is also called midrange length scale) is characterized by similar local trench sizes with varying pattern density over the mask filed.

The feature scale is demonstrated at 350. The feature scale represents the smallest scale of interest. The feature scale is the thickness measurements over patterned features. While it is common for the feature scale to be below 1000 nm in many implementations, the actual scale is dependent on the specific application and specific design rules.

Figure 4:
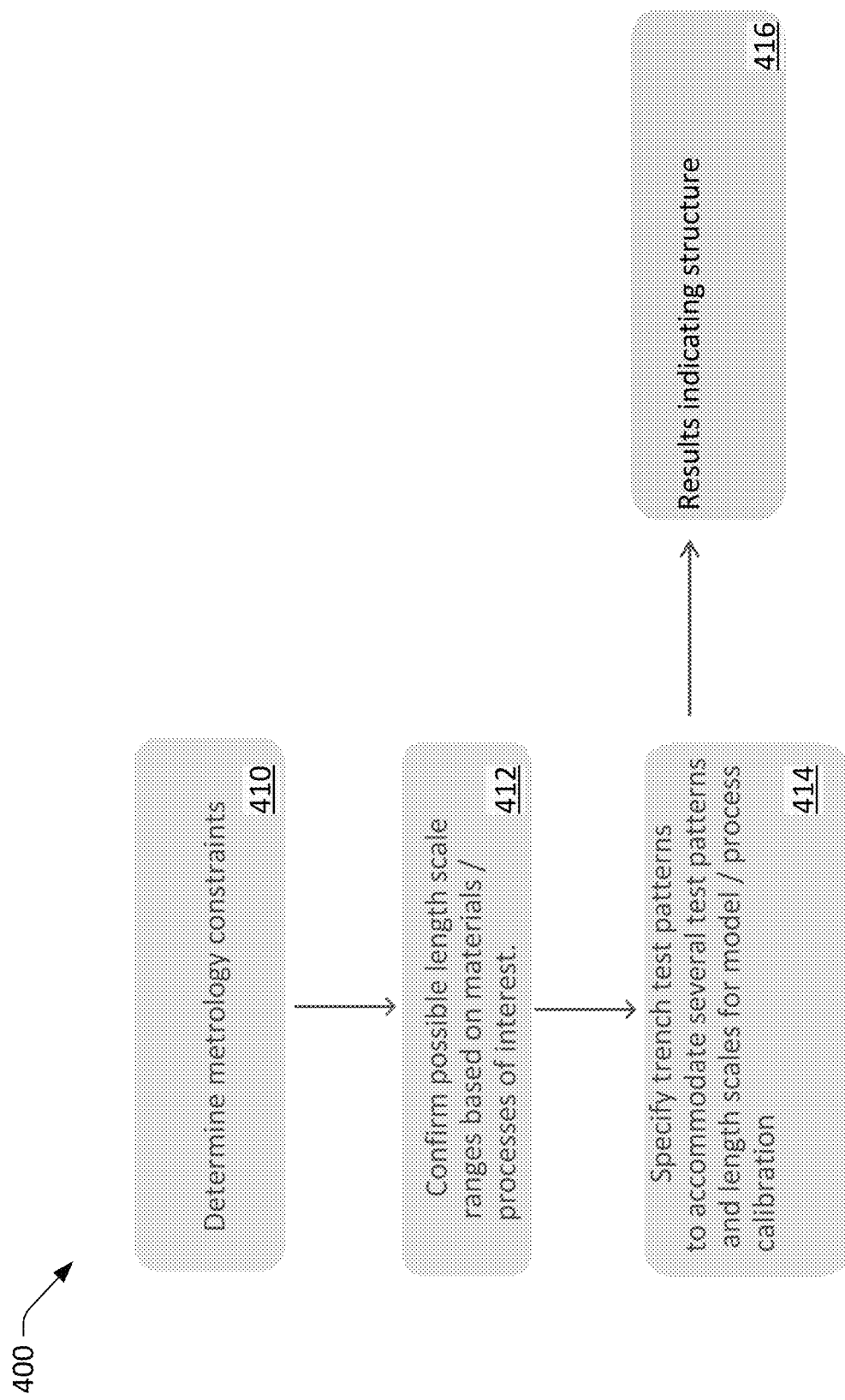
FIG. 4 provides a flow chart illustrating a method of calibrating a film coating model over topography and designing test structures for metrology and calibration in accordance with the technology described herein.
Figure 5:
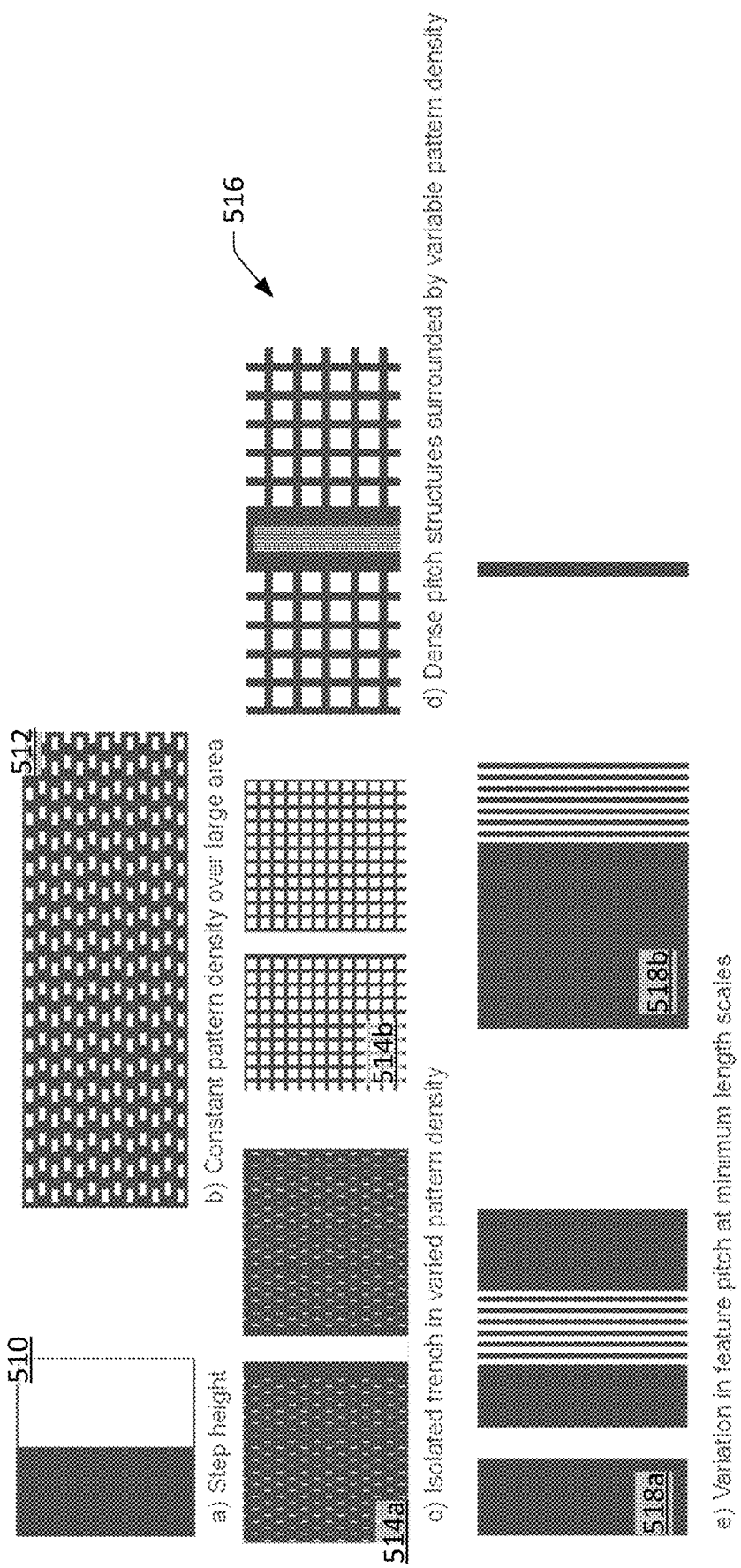
FIG. 5 provides examples of test structure designs for model calibration in accordance with the technology described herein.

FIG. 4 illustrates an example process 400 for the design of test structures. As part of the model calibration process of the model creation 120, test structures are designed and placed on an experimental mask that can be used for film thickness metrology. Design constraints typically center around metrology, process, materials, and available area on the mask. Metrology options for feature scale, and die scale length considerations may involve, but are not limited to: TEM (transmission electron microscope) cross-section, SEM (scanning electron microscope) cross-section, profilometry, PWG (patterned wafer geometry), scatterometry, etc.

At 410, a computer system determines or employs determined metrology constraints. Such constraints include the field of view, sampling rate, resolution, precision, etc. From this various metrology, options are available. Examples of such options include TEM, SEM cross section, profilometry, ellipsometry, PWG (patterns wafer geometry) and scatterometry.

At 412, the computer system confirms possible length scale ranges based on material and processes of interest. In some instances, the materials and applications may not have varied thickness over particular length scales. In those instances, perhaps less than three length scales are desirable. For instance, a spin on carbon material may exhibit different thicknesses that require modeling over topography at feature scale, but not over larger areas such as die scale or wafer scale. With another material and application, for example, a spin on dielectric material used over more complicated topography may exhibit different trends over feature scale, die scale and wafer scale, and therefore it would be desirable to have a calibrated model taking into account all of those length scales. In other words, advance knowledge of process, application, and material helps determine where film thickness measurements are helpful to properly calibrate a model.

At 414, the computer system specifies trench test patterns in an industry standard file format for circuit design data or mask data (e.g., GDS or graphic database system format) to accommodate several test patterns and length scales for model/process calibration. That is, the drawing test structures are stored in a design file and then this design file is transferred to a mask that can be used to process the topography structures and then later measure film thicknesses for model calibration. During this operation, the computer system creates different topography design structures to span enough variation to get sufficient information for calibrating a model.

At 416, the computer system produces the results that indicate structure. Examples of such results includes step height iso-trench, dense pitch, and variable surrounding pattern density. The step height refers to a situation where there is only one step change in topography. This is basically the simplest topography feature one could have where the film transitions over one step change only. The iso-trench is an isolated trench. This is essentially two step heights or one single trench, and this is the next simplest topography trench structure to model. A dense pitch drawing involves several trenches drawn close together.

All of these structures could be surrounded by "variable pattern density." The variable pattern density indicates the density of the trenches that surrounds the specified structures. For example, the surrounding area may have no trenches, all trenches (100% trenches), or you could have some varied percent of trenches to test how the material fills different surrounding areas. As an analogy, consider a river during a flood. If there are many trenches and low areas around the river the water will go there. If there are no areas as low as the river bed, the water will spread, travel far and flood quickly. So, the percentage of low lying areas for the water to flow to around the river affects how the water gets distributed FIG. 5 demonstrates a variety of example test patterns that can be used for feature scale and mask scale model calibration. Certain specific structures should be available on the mask when considering the calibration of the model.

Example pattern 510 is a height structure used for characterizing 1D film transition over the maximum topography height. Example pattern 512 is a large area of constant pattern density, which will be characterized by an appropriate metrology tool, (e.g. PWG), and these types of structures are particularly relevant for characterizing mask scale signatures. Additional types of patterns include isolated or dense trenches surrounded by variable pattern densities at flexible radial distances around metrology points of interest. For example, patterns 514a and 514b demonstrate isolated trench in varied patterns densities, and example pattern 516 shows dense pitch structures surrounded by variable pattern density.

Another type of pattern is 1D pitch variations, including isolated and dense structures. These designs are created for large field of view SEM cross sections to characterize feature scale changes in one captured image. An example of that is patterns 518a and 518b showing variation in feature pitch at minimum length scales.

Figure 6:
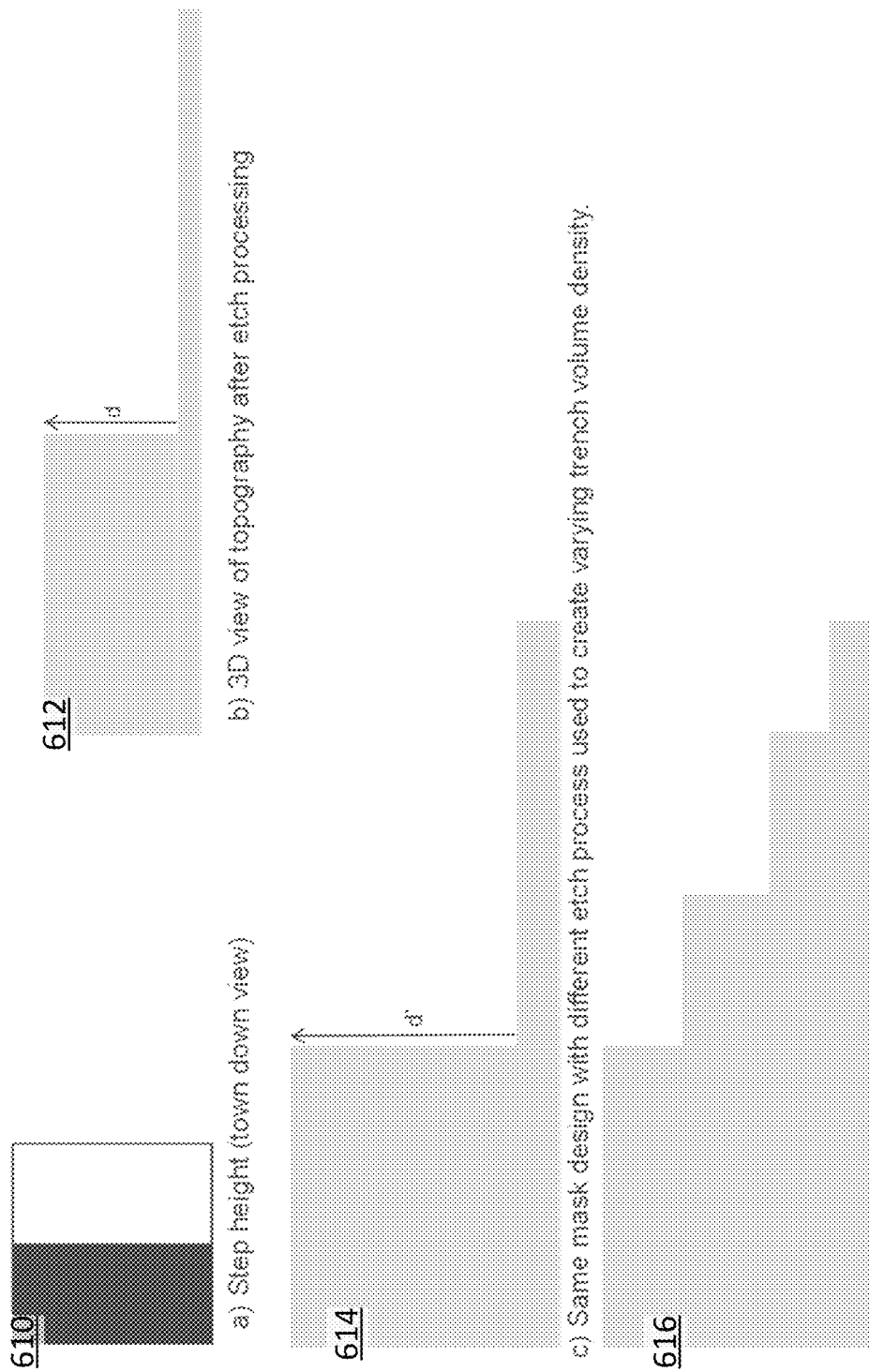
FIG. 6 provides examples of three-dimensional (3D) structures in accordance with the technology described herein.

FIG. 6 shows a top-down view of a trench design (i.e., mask) at 610. Views 612-616 shows alternative cross-section views of a resulting feature topography after etch processing of the same trench design 610. View 612 shows a single depth trench with a depth of d. View 614 shows a resulting feature topography using the same mask as 612 but with a different etch process that produces a different trench depth of d'. View 616 shows another different feature topography using the same mask as 612 but with a trench having different stepped depths.

This illustrates the concept of creating alternate 3D trench structures from the same 2D test structure mask design. For example, using a modified etch process could create a deeper trench providing a new calibration structure and additional thickness data for model calibration. This demonstrates using multiple patterning processes to create varying trench depths, creating new topography features and multiple metrology points for calibration over a single trench as viewed from the top down.

Developing a metrology sample plan for model calibration and verification is dependent on understanding coating responses at length scales of interest. The feature scale metrology sample plan should include the structures defined in FIG. 5 along with some base structures (i.e. step height and isolated trench) that can be used for across mask and/or across wafer metrology.

FIG. 7 shows an example process 700 for defining an appropriate sample plan. At 710, a computer system determines feature scale metrology points from structures (such as those shown in FIG. 4). This includes base structures for sampling across mask/wafer. Mask 712 and feature 714 illustrate examples of the scale at which this action operates.

At 720, the computer system determines across-mask metrology sampling from base structures as well as large area pattern density samples. An example of this is shown at 722. Base structures are sampled across the mask field (e.g. cross-section SEM or profilometry). The defined area pattern density structures are sampled across the mask field (e.g. PWG).

At 730, the computer system determines across wafer metrology sampling from base structures as well as large area pattern density samples. This is depicted at 732. This action involves sampling a consistent pattern within mask locations across the wafer, identifying potential radial signatures and accounting for other known post processing signatures (e.g., signatures, etch back, or UV illumination).

After base feature structures are identified an across mask sample plan can be determined, and large area structures can also be sampled across mask. Appropriate statistical sampling should prove the absence or presence of any across mask signature, and verify the length scales at which pattern density values affect coating thickness. Likewise, these measurements can be sampled across the wafer looking for radial signatures and taking into account any other known processing signatures that may exist.

Figure 8:
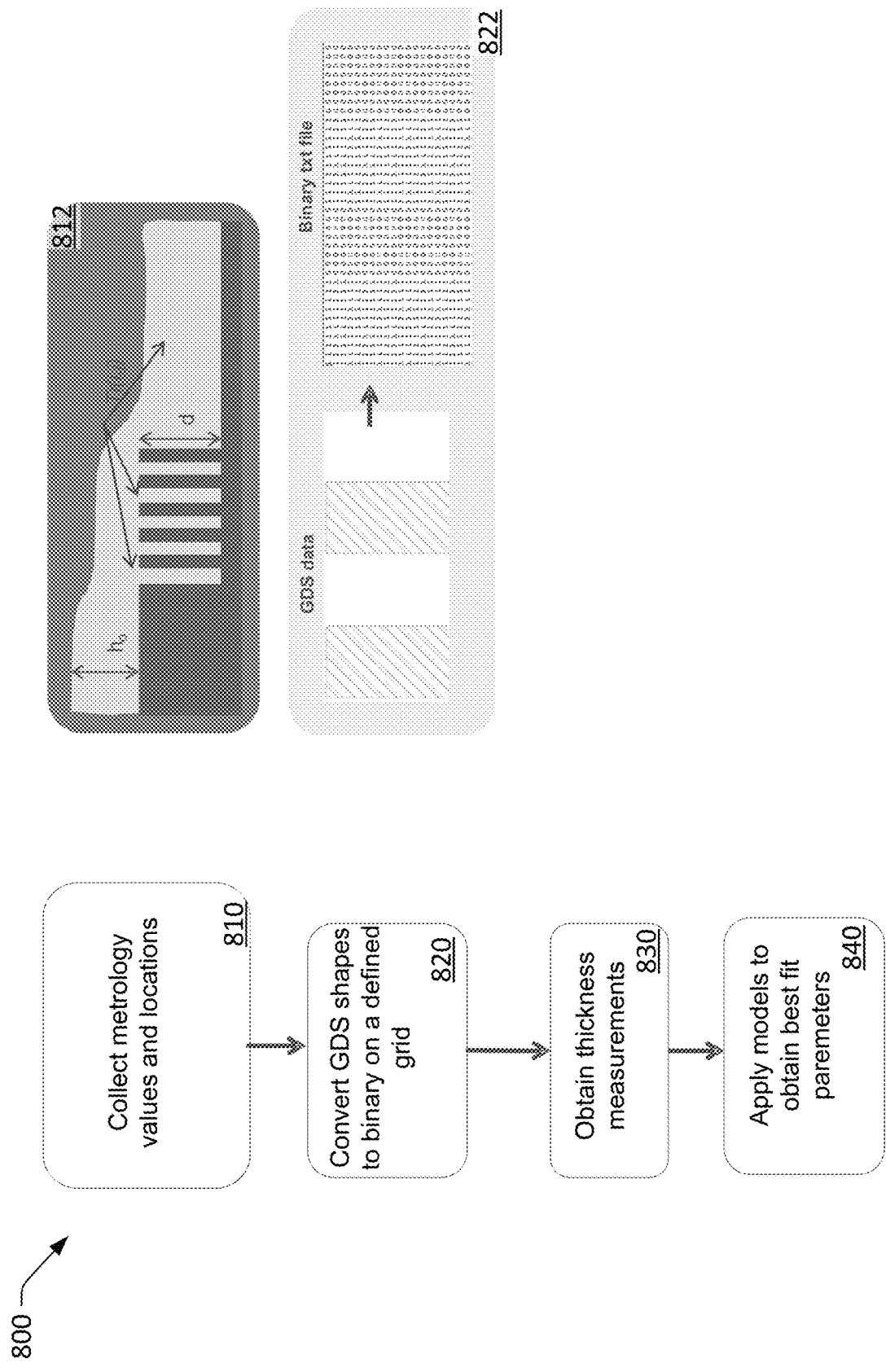
FIG. 8 provides a flow chart and illustration depicting a method for calibrating a film coating model over topography on a substrate in accordance with the technology described herein.

FIG. 8 illustrates a processing method for model calibration. After a sample plan is defined and metrology is completed on a desired material/process combination.

At 810, a computer system collects metrology values and locations and then the system collates design files (GDS) or mask files with trench patterns and surrounding patterns to provide relevant inputs. Examples of such input include feature design dimensions, GDS clips with surrounding pattern density, mask tone, and film thickness measurement values, metrology, trench patterns/pattern density, and mask tone. Examples of such is shown at 812, which shows a simplified version of the graph depicted in FIG. 10 and described later.

At 820, the computer system converts the design file shapes (labeled at GDS data) into binary text files on a user defined grid (e.g., locations of trenches). Metrology values are input into a mirrored text file on an identical grid. Box 822 illustrates the actions of block 820.

At 830, the computer system obtains input regarding film thickness measurement values and locations that match the defined pattern.

At 840, the computer system applies the pattern density models to obtain the best-fit parameters. This may be accomplished through a minimization routine (e.g., script) such as Nelder-Mead. Here, the best-fit algorithm is used to fit the best values from floating parameters and output model error relative to experimental data. Details on the functional form of pattern density models are discussed below with regard to FIG. 9.

One possible functional form of the film height related to an x, y grid is the sum of a constant multiplied by a selectable proximity function convoluted with trench x, y locations within the grid. One example of a proximity function is shown in the Gaussian form. In this form, the trench depth, as well as a search radius, are shown to relate trench locations to film height above those coordinates. This is one example of a functional form that can be used in a minimization routine to provide best-fit parameters and ultimately one mathematical description of a film height over trench topography.

Planarization Prediction

Figure 9:
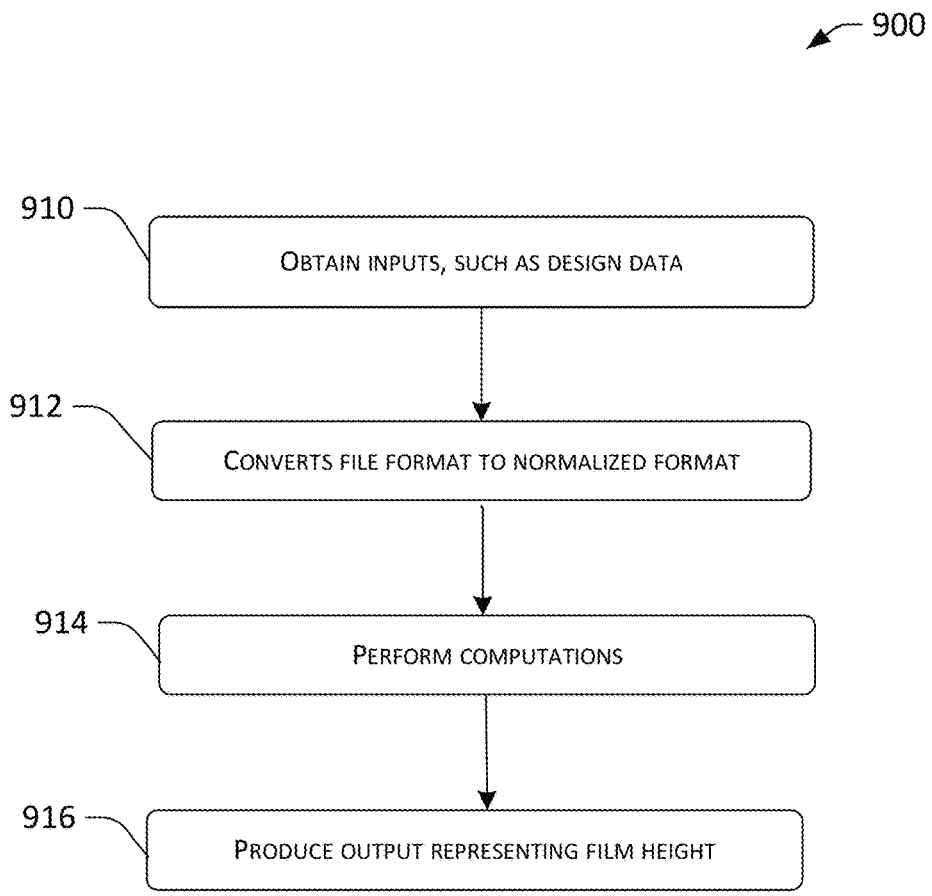
FIG. 9 provides a flow chart illustrating a method of applying a calibrated spin coating model to predict film thickness in accordance with the technology described herein.

FIGS. 9 (in full) and 10 (partially) illustrate and demonstrate example processes and details related to the planarization prediction 130 of FIG. 1. FIG. 9 demonstrates an example process 900 for applying the calibrated model to a new design file.

At 910, a computer system obtains various inputs, such as design data, appropriate tone (positive/negative) of design topography, trench thickness as a function of design input or constant, grid size, and the calibrated film thickness model.

At 912, the computer model converts the file of design data from one format to another. The topography design data is typically file format specifically associated with such data. Examples of such file formats include GDS, Oasis, etc. The design data file is converted to a "normalized" file format (e.g., text file) with trench locations on a chosen input grid.

At 914, the computer system performs computations using, for example, Equation 1 (below) across the converted design file.

$$h(x,y) = h_0 + \Sigma C_i p(x,y) * Tr(x,y) \quad \text{Equation 1}$$

h(x, y)=film z height at given x, y location
$h_o$=constant, representing blanket film thickness with no topography
$C_i$=constant
p(x, y)=selectable proximity function
Tr(x, y)=Trench pattern locations $$p(x, y) = \frac{d}{\pi\sigma^2} e^{-\frac{(x^2+y^2)^{1/2}}{\sigma^2}}$$

d=trench depth
σ=search radius

This equation and its variables are shown in FIG. 10. Of course, other implementations may utilize other equations.

FIG. 10 depicts a simplified cross-section 1000 of a portion of a substrate 1020 with an etched layer thereon. The etched layer has features such as 1022 and 1024. A blanket coat 1030 is shown over the layer and the features of the layer. The figure also shows the definitions of various terms used in this illustration. Here, the converted design file is read as input. A calculation distance from each grid point is set as input. This allows calculations to take into account trench placements within that radius.

Typically, this should be set greater than a. In practice, 3 σ is a good choice. For each grid point, the calculation distance defines an area of the other grid points included in the calculation. Equation 1 is applied to each individual grid point, using surrounding grid point values with the calculation radius, resulting in a film thickness value at each x, y grid point. The calculated thickness values at each x, y grid location are output to an output file.

At 916, the computer system generates output (typically, as a text file) that represents the spun on film height at x, y locations at each grid point in the provided design file. This can also be represented in 3-dimensional form with utilities such as MATLAB®.

Figure 11:
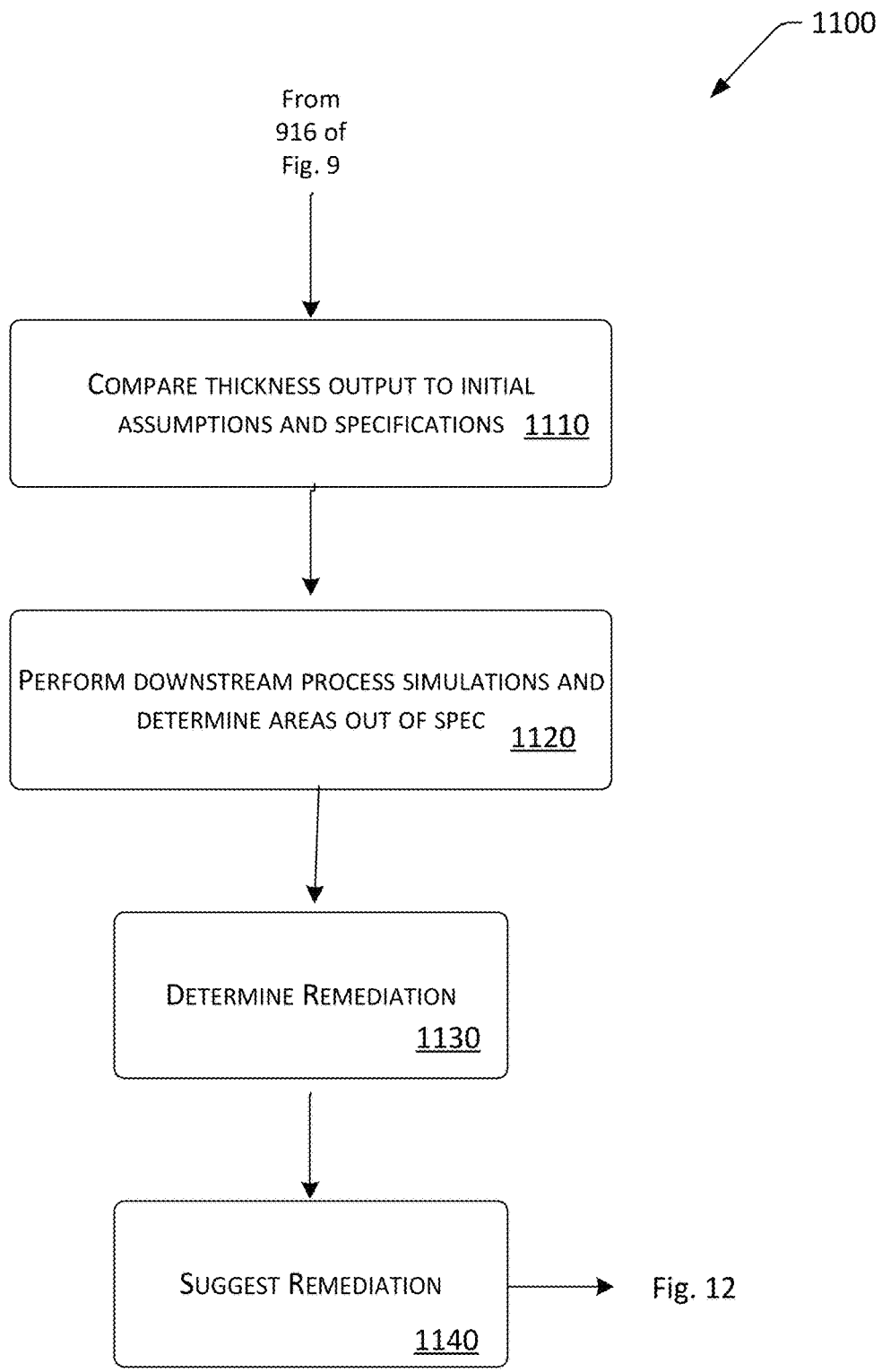
FIGS. 11-12 provide flow charts illustrating a method of applying a calibrated spin coating model, including a feedback methodology for electronic design automation and a feed-forward methodology for unit processing in accordance with the technology described herein.

FIG. 11 illustrates example process 1100 to demonstrate feed backward and feed forward applications. Example process 1100 continues from the output operation 916 of process 900.

At 1110, a computer system compares the thickness output of operation 916 of FIG. 9 to initial assumptions and specifications. That is, the system determines how the thickness determination of process 900 compares to the procedure's assumptions and provided specifications. In doing so, the system determines if any film thickness or overall deviation in film thickness is beyond desired ranges.

At 1120, the computer system performs downstream process simulations based on the film thickness map input (from process 900). Based on this, the system determines if process outputs are out of specification due to incoming deviations in film thickness. That is, the system predicts how planar the resulting film will be across the expanse of the film.

Operations 1110 and 1120 are part of the planarization prediction 130 of FIG. 1. Thus, operation 1120 is the result of the planarization prediction 130. The next operations (1130 and 1140) are part of the remediation suggestion 140 of FIG. 1.

At 1130, the computer system determines remediation for planarization of a simulated film applied to a feature topology described the inputs of 910 of FIG. 9. That is, the system determines what actions or combinations of actions that would encourage or facilitate planarization of the simulated film—and, then ultimately, to an actual spin-coat applied under the remediated conditions. Example remedial actions will be discussed below with regard to FIG. 12.

At 1140, the computer system suggestions a remedial action or some combination of such action. This suggestion may include a user-interface (UI) that provides textual and/or graphical recommendations of the suggested actions that an operator may take manually or semi-automatically. An operator may select one or more of the suggested actions that are subsequently performed automatically or semi-automatically. These suggestions are offered to operation 1210 of FIG. 12.

Figure 12:
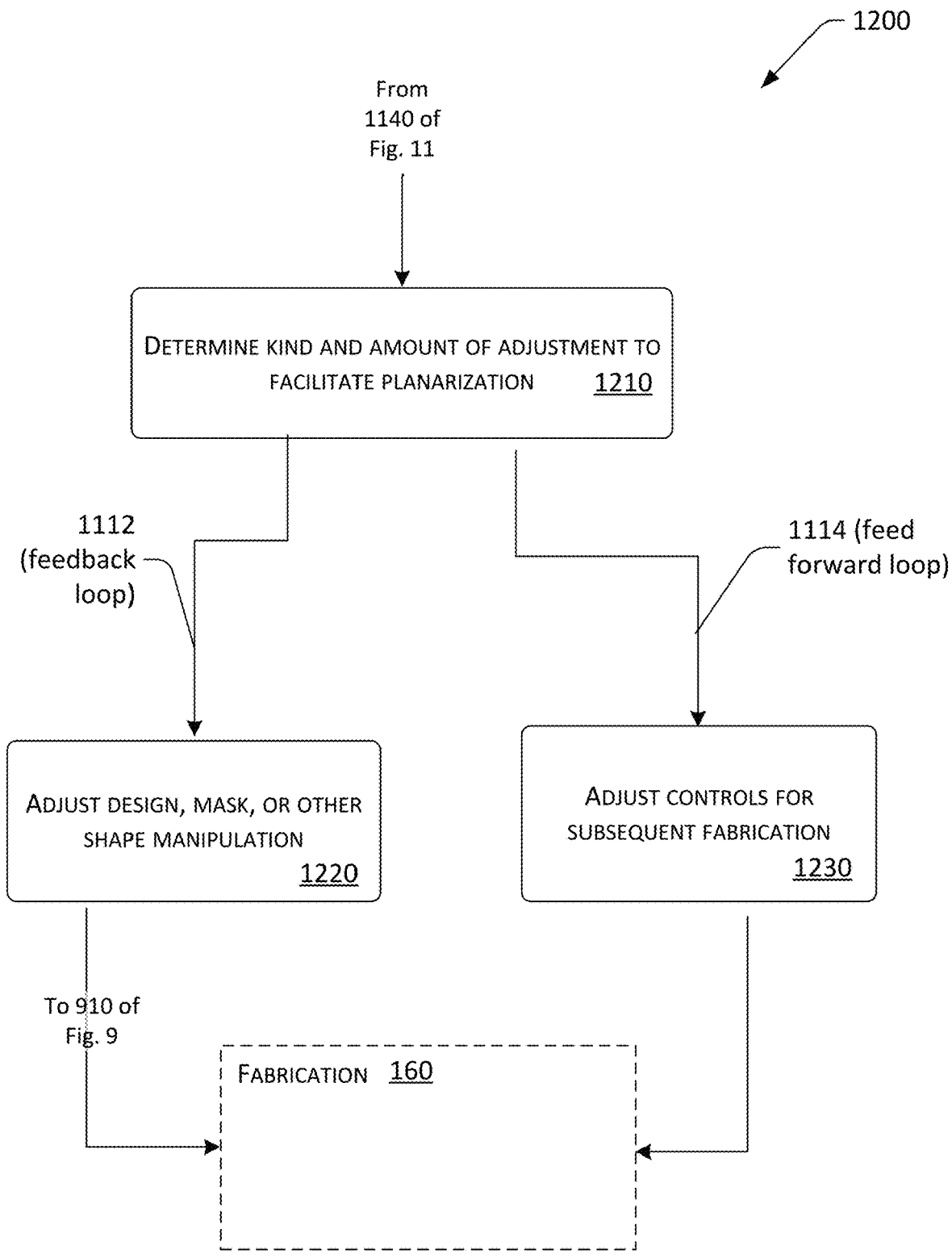

FIG. 12 illustrates and demonstrates example process related to the remediation 150 of FIG. 1. FIG. 9 demonstrates an example process 1200 for planarization remediation of the feature topography of the wafer.

At 1210, a computer system receives remediation suggestions from operation 1140 of FIG. 11 and/or information regarding planarization determination performed by operation 1120. Based on this, the system determines the kind and/or amount of adjustment to be performed that will facilitate and encourage planarization (i.e., flatness) of the film on the feature topography of the wafer. In some ways, the functions of this operation 1210 are similar to those performed by operation 1130 and 1140. Therefore, in practice, the functionalities of operations 1210, 1130, and 1140 may be combined in some effective manner.

A feedback loop 1220 is activated when there is a determination that planarization may be improved by, at least in part, a change to the physical arrangement of the feature topology in a manner that does not change its operational parameters. That is, the triggering determination includes a change in pattern topography that does not affect the functionality of the resulting devices of the wafer.

This involves an adjustment in design, mask, or other feature shape manipulation that is, at least in part, an effective manner to facilitate planarization. In that instance, the process continues to operation 1220 and forms a feedback loop 1220 with operation 910 of FIG. 9. In this situation, information about the simulated film being non-planar is fed back to operation 910 of the process 900 to facilitate adjustment of that process. This action ultimately adjusts/changes an actual fabrication process of the fabrication 160. In so doing, the adjusted design will lead to a new feature topography to simulate.

The information is used in the feed backward loop 1220 to make adjustments in design, mask, or other shape manipulations in the data prep flow, such as shapes placed only for processing purposes with no electrical functionality. The adjustments may be to the design, dummy fill, or other mask/EDA (electronic design automation). These adjustments change the pattern density to bring the process simulations into the specification.

Alternatively, a feed forward loop 1230 is activated to improve planarization in some way other than a re-design that will not affect the resulting functionality of the devices of the wafer.

In the alternate feed forward loop 1230, out of specification information or process simulations is used to indicate control tightening for subsequent unit processes. That is, a change in the operation of some portion of the fabrication 160 follows the creation of the simulated feature topography. The system directs an adjustment to subsequent fabrication process controls to compensate for out of specification film thickness or other non-flat aspects of the simulated film.

There are many different actions that could be directed and taken. The examples may include adjusting spin-on coating process (e.g., spin velocity, the amount of coating applied, the rate of coating applied, spin acceleration, deposit location(s), etc.), baking process, or sequence of spin process steps. Another example includes adjusting lithography scanner process to control focus/dose. Still another example may involve adjustments to the etch process to compensate for material thickness (or lack thereof). That is, film height control during etching. Another still involves adjustment to downstream coating/deposition processes to help balance total planarization over topography. This helps with the overall planarization of the layer stack. Of course, other remedial actions are available.

Additional and Alternative Implementation Details

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, mask, or a layer on or overlying a base substrate structure such as a thin film. Thus, the substrate is not limited to any particular base structure, underlying layer or overlying layer, patterned or un-patterned but rather, is contemplated to include any such layer or base structure, and any combination of layers and/or base structures. The description may reference particular types of substrates, but this is for illustrative purposes only.

Reference herein to "one embodiment" or "an embodiment" refers to one or more features, structures, materials, or characteristics described at least one example embodiment of the technology described herein. It does not denote or imply that the features, structures, materials, or characteristics are present in every embodiment. Thus, the appearances of the phrases "in one embodiment" or "in an embodiment" in various places throughout this document are not necessarily referring to the same embodiment of the technology. Furthermore, the features, structures, materials, or characteristics may be combined in any suitable manner in one or more embodiments.

In the above description of example implementations, for purposes of explanation, specific numbers, materials configurations, and other details are set forth to explain better the present invention, as claimed. However, it will be apparent to one skilled in the art that the claimed invention may be practiced using different details than the example ones described herein. In other instances, well-known features are omitted or simplified to clarify the description of the example implementations.

The inventors intend the described example implementations to be primarily examples. The inventors do not intend these example implementations to limit the scope of the appended claims. Rather, the inventors have contemplated that the claimed invention might also be embodied and implemented in other ways, in conjunction with other present or future technologies.

Moreover, the word "example" is used herein to mean serving as an example, instance, or illustration. Any aspect or design described herein as "example" is not necessarily to be construed as preferred or advantageous over other aspects or designs. Rather, use of the word example is intended to present concepts and techniques in a concrete fashion. The term "techniques," for instance, may refer to one or more devices, apparatuses, systems, methods, articles of manufacture, and computer-readable instructions as indicated by the context described herein.

As used in this application, the term "or" is intended to mean an inclusive "or" rather than an exclusive "or." That is unless specified otherwise or clear from context, "X employs A or B" is intended to mean any of the natural inclusive permutations. That is if X employs A; X employs B; or X employs both A and B, then "X employs A or B" is satisfied under any of the preceding instances. Also, the articles "an" and "an" as used in this application and the appended claims should be construed to mean "one or more," unless specified otherwise or clear from context to be directed to a singular form.

These processes are illustrated as a collection of blocks in a logical flow graph, which represents a sequence of operations that can be implemented in mechanics alone or a combination of hardware, software, and firmware. In the context of software/firmware, the blocks represent instructions stored on one or more computer-readable storage media that, when executed by one or more processors, perform the recited operations.

Note that the order in which the processes are described is not intended to be construed as a limitation and any number of the described process blocks can be combined in any order to implement the processes or an alternate process. Additionally, individual blocks may be deleted from the processes without departing from the spirit and scope of the subject matter described herein.

The term "computer-readable media" is non-transitory computer-storage media. For example, non-transitory computer-storage media may include, but are not limited to, magnetic storage devices (e.g., hard disk, floppy disk, and magnetic strips), optical disks (e.g., compact disk (CD) and digital versatile disk (DVD)), smart cards, flash memory devices (e.g., thumb drive, stick, key drive, and SD cards), and volatile and non-volatile memory (e.g., random access memory (RAM), read-only memory (ROM)). Similarly, the term "machine-readable media" is non-transitory machine-storage media. Likewise, the term "processor-readable media" is non-transitory processor-storage media.

A non-transitory machine-readable storage medium can cause a machine to perform the functions or operations described, and includes any mechanism that stores information in a form accessible by a machine (e.g., computing device, electronic system, etc.), such as recordable/non-recordable media (e.g., read-only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface is configured by providing configuration parameters or sending signals to prepare the communication interface to provide a data signal describing the software content. The communication interface can be accessed via one or more commands or signals sent to the communication interface.

In the claims appended herein, the inventors invoke 35 U.S.C. § 112(f) only when the words "means for" or "steps for" are used in the claim. If such words are not used in a claim, then the inventors do not intend for the claim to be construed to cover the corresponding structure, material, or acts described herein (and equivalents thereof) in accordance with 35 U.S.C. 112(f).

A non-transitory machine-readable storage medium can cause a machine to perform the functions or operations described, and includes any mechanism that stores information in a form accessible by a machine (e.g., computing device, electronic system, etc.), such as recordable/non-recordable media (e.g., read-only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface is configured by providing configuration parameters or sending signals to prepare the communication interface to provide a data signal describing the software content. The communication interface can be accessed via one or more commands or signals sent to the communication interface.

What is claimed is:

1. A method of facilitating spin-coat planarization over feature topography during substrate fabrication, the method comprising:
   generating, using a data processor, a topography map for a desired pattern of features on a semiconductor substrate, the generating of the topography map being based, at least in part, on substrate patterning information related to the desired pattern of features;
   generating, using the data processor, a film-thickness model for predicting film thickness of a spin-on coating applied to the desired pattern of features, wherein inputs for the film-thickness model include the topography map and an estimated film thickness of the spin-on coating applied on the semiconductor substrate according to defined coating process parameters;
   generating, using the data processor, a film-thickness output from the film-thickness model by:
      assigning a plurality of grid points across the semiconductor substrate,
      determining a trench depth at or around each of the plurality of grid points on the semiconductor substrate based, at least in part, on the topography map,
      assigning a calculation distance from each of the plurality of grid points, and
      calculating a film thickness value for each grid point in the plurality of grid points based, at least in part, on the estimated film thickness, the trench depth proximate to each grid point, a surface area around each grid point, and film thickness values from other grid points within the calculation distance;
   determining, using the data processor, whether a predicted film thickness of an area of the film-thickness output falls within a defined range; and
   based upon that determining, either declaring the predicted film thickness of the area of the film-thickness output to be planar, or generating, using the data processor, suggested remedies to enhance planarization of the predicted film thickness of the area of the film-thickness output, wherein the suggested remedies affect the substrate fabrication.

2. The method of claim 1, further comprising:
   selecting one or more of the suggested remedies; and
   performing the one or more selected suggested remedies.

3. A method of facilitating spin-coat planarization over feature topography during substrate fabrication, the method comprising:
   receiving substrate patterning information related to a desired pattern of features for a semiconductor substrate;
   generating, using a data processor, a topography map for the desired pattern of features based, at least in part, on the substrate patterning information;
   receiving data regarding a plurality of film thickness points associated with a film deposited on a patterned substrate having the desired pattern of features;
   generating, using the data processor, a film-thickness model for predicting film thickness for the semiconductor substrate, wherein inputs for the film-thickness model include the data of the plurality of film thickness points; and
   generating, using the data processor, a film-thickness output from the film-thickness model by:
      assigning a plurality of grid points across the semiconductor substrate,
      determining a trench depth at or around each of the plurality of grid points on the semiconductor substrate based, at least in part, on the topography map,
      assigning a calculation distance from each of the plurality of grid points, and
      calculating a film thickness value for each grid point in the plurality of grid points based, at least in part, on an estimated film thickness, the trench depth proximate to each grid point, a surface area around each grid point, and film thickness values from other grid points within the calculation distance.

4. The method of claim 3, wherein the substrate patterning information comprises feature dimensions, mask tone, or film thickness measurement values.

5. The method of claim 3, wherein the topography map comprises features varying by height, width, and distance between the features.

6. The method of claim 3, wherein the inputs for the film-thickness model further include the estimated film thickness based, at least in part, on a blanket film thickness, a localized pattern height, a localized pattern width, and a surrounding density of features on the semi conductor substrate.

7. The method of claim 3, wherein the plurality of film thickness data comprises thickness data of one or more films on the patterned substrate.

8. The method of claim 3, wherein the film comprises a blanket film, a patterned film, or a treated film.

9. A method for predicting planarity of a spin coating process comprising:

receiving substrate patterning information for a patterned substrate;

receiving a film-thickness model for predicting film thickness for the patterned substrate, wherein inputs for the film-thickness model include an estimated thickness of a film spun onto the patterned substrate and an arrangement of features on the patterned substrate; and generating, using a data processor, a film-thickness output from the film-thickness model by:

assigning a plurality of grid points across the patterned substrate, determining a trench depth at or around each of the plurality of grid points on the patterned substrate, assigning a calculation distance from each of the plurality of grid points, and calculating a film thickness value for each grid point in the plurality of grid points based, at least in part, on a blanket film thickness, the trench depth proximate to each grid point, a surface area around each grid point, and film thickness values from other grid points within the calculation distance.

10. The method of claim 9, wherein the estimated thickness is based, at least in part, on the blanket film thickness and topography of the patterned substrate.

11. The method of claim 9, wherein the arrangement of features is based, at least in part, on one or more of the following: feature depth, feature width, or feature surface area at different locations across the patterned substrate.

12. The method of claim 9 further comprising:

comparing the film-thickness output to a predetermined specification; and adjusting one or more process conditions based, at least in part, on the comparing of the film-thickness output and the predetermined specification.

13. The method of claim 12 wherein the one or more process conditions include one or more of the following: spin speed for the film being deposited on the patterned substrate, focus or dose of a lithography process used to pattern the patterned substrate, etch time, or etch power.

14. The method of claim 9 further comprising:

comparing the film-thickness output to a predetermined specification;

adjusting one or more process targets based, at least in part, on the comparing of the film-thickness output with the predetermined specification.

15. The method of claim 14 wherein the one or more process targets include one or more of the following: deposition thickness, trench depth, film non-uniformity.

16. The method of claim 9 further comprising:

comparing the film-thickness output to a predetermined specification; and adjusting one or more design conditions based, at least in part, on the comparing of the film-thickness output and the predetermined specification.

17. The method of claim 16 wherein the design conditions include one or more of the following: device layout, dummy fill layout, mask layout, or other conditions that impact pattern density on the patterned substrate.

18. The method of claim 9, wherein the film-thickness model includes thickness data of one or more films on the patterned substrate.

19. The method of claim 9, wherein the film comprises a blanket film, a patterned film, or a treated film.

\* \* \* \* \*